(12) United States Patent
Steigerwald

(10) Patent No.: US 8,951,817 B2
(45) Date of Patent: Feb. 10, 2015

(54) LIGHT EMITTING DEVICE CHIP SCALE PACKAGE

(75) Inventor: Daniel Alexander Steigerwald, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/997,673

(22) PCT Filed: Dec. 29, 2011

(86) PCT No.: PCT/IB2011/056010
§ 371 (c)(1),
(2), (4) Date: Jun. 25, 2013

(87) PCT Pub. No.: WO2012/101489
PCT Pub. Date: Aug. 2, 2012

(65) Prior Publication Data
US 2013/0292716 A1 Nov. 7, 2013

Related U.S. Application Data

(60) Provisional application No. 61/435,368, filed on Jan. 24, 2011.

(51) Int. Cl.
*H01L 21/00* (2006.01)
*H01L 33/08* (2010.01)
(Continued)

(52) U.S. Cl.
CPC .............. *H01L 33/08* (2013.01); *H01L 33/62* (2013.01); *H01L 33/50* (2013.01); *H01L 33/0079* (2013.01); *H01L 2933/0066* (2013.01); *H01L 2224/16105* (2013.01); *H01L 2224/03002* (2013.01); *H01L 2224/17107* (2013.01); *H01L 2224/32105* (2013.01); *H01L 24/03* (2013.01); *H01L 24/05* (2013.01); *H01L 24/13* (2013.01); *H01L 24/16* (2013.01); *H01L 24/17* (2013.01); *H01L 24/29* (2013.01); *H01L 24/32* (2013.01); *H01L 21/6835* (2013.01); *H01L 2221/6835* (2013.01); *H01L 2221/68377* (2013.01); *H01L 2224/0346* (2013.01); *H01L 2224/0401* (2013.01); *H01L 2224/04026* (2013.01); *H01L 2224/05647* (2013.01); *H01L 2224/131* (2013.01); *H01L 2224/16227* (2013.01); *H01L 2224/16238* (2013.01); *H01L 2224/291* (2013.01); *H01L 2224/32227* (2013.01);
(Continued)

(58) Field of Classification Search
None
See application file for complete search history.

(56) References Cited

U.S. PATENT DOCUMENTS

| | | | |
|---|---|---|---|
| 7,329,905 B2 | 2/2008 | Ibbetson et al. | |
| 2006/0278885 A1 | 12/2006 | Tain et al. | |
| 2011/0300644 A1* | 12/2011 | Akimoto et al. | 438/7 |

FOREIGN PATENT DOCUMENTS

EP 2197051 A2 6/2010

*Primary Examiner* — Sonya D McCall Shepard

(57) ABSTRACT

The substrate that is used to support the growth of the LED structure is used to support the creation of a superstructure above the LED structure. The superstructure is preferably created as a series of layers, including conductive elements that form a conductive path from the LED structure to the top of the superstructure, as well as providing structural support to the light emitting device. The structure is subsequently inverted, such that the superstructure becomes the carrier substrate for the LED structure, and the original substrate is thinned or removed. The structure is created using materials that facilitate electrical conduction and insulation, as well as thermal conduction and dissipation.

21 Claims, 4 Drawing Sheets

(51) Int. Cl.
  *H01L 33/62* (2010.01)
  *H01L 33/50* (2010.01)
  *H01L 33/00* (2010.01)
  *H01L 23/00* (2006.01)
  *H01L 21/683* (2006.01)

(52) U.S. Cl.
  CPC .................. *H01L2224/32238* (2013.01); *H01L 2224/05568* (2013.01); *H01L 2224/16225* (2013.01)
  USPC ........... 438/29; 257/13; 257/E33.001; 257/99

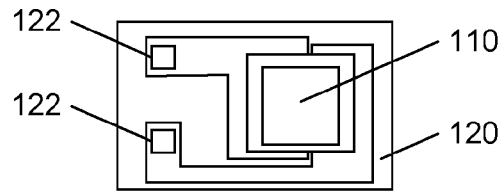
FIG. 1 [PRIOR ART]
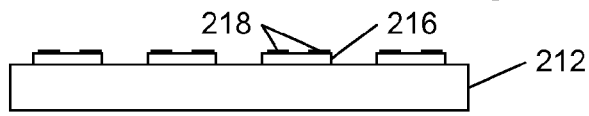
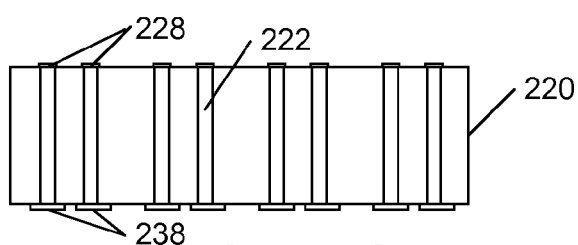
FIG. 2A [PRIOR ART]
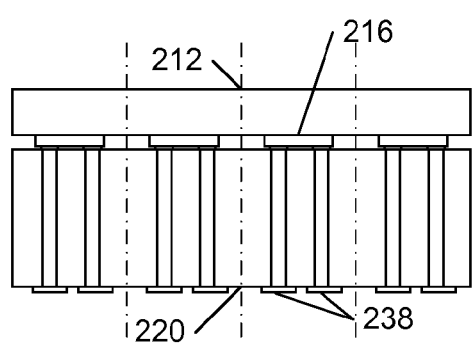
FIG. 2B [PRIOR ART]
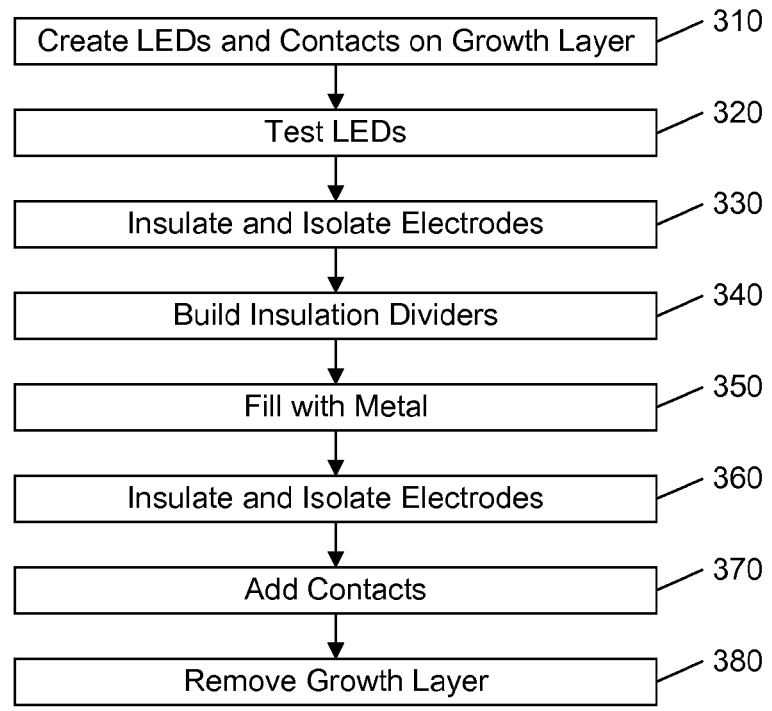
FIG. 3 ably well suited for creating multiple light emitting devices on a wafer or other

LIGHT EMITTING DEVICE CHIP SCALE PACKAGE

FIELD OF THE INVENTION

This invention relates to the field of solid state light emitting devices, and in particular to a light emitting device in a chip scale package, and a method of manufacturing such a device

BACKGROUND OF THE INVENTION

Light emitting devices (LEDs), and particularly those operating at greater than approximately a quarter watt, generally include a semiconductor element that provides the light, and one or more non-semiconductor elements that provide mechanical support, electrical connections, thermal dissipation, wavelength conversion, and so on.

As the popularity and the field of use of solid-state LEDs continue to expand, the potential for profit from large quantity sales increases, as does the competition for such sales among manufacturers. In such an environment, the even minor savings in per-unit costs can have a major impact on profitability. Accordingly, manufacturers of LEDs strive to reduce material costs and manufacturing costs.

FIG. 1 illustrates a conventional medium-to-high power LED comprising semiconductor elements 110 and at least two non-semiconductor elements: a ceramic substrate 120, and a pair of electrodes 122. As can be seen, in this embodiment, the ceramic substrate 120 is well over twice the area of the light emitting semiconductor structure 110; the extra area primarily being used to facilitate external connections to the semiconductor structure 110 via the electrodes 122. Accordingly, the substrate 120 accounts for a relatively significant portion of the material cost of the device. Additionally, placing the semiconductor structure 110 on the substrate 120 generally requires a precise pick-and-place process, which adds to the manufacturing cost of the device.

U.S. Pat. No. 7,329,905, "CHIP-SCALE METHODS FOR PACKAGING LIGHT EMITTING DEVICES AND CHIP-SCALE PACKAGED LIGHT EMITTING DEVICES", issued 12 Feb. 2008 to Ibbetson et al. discloses a technique that uses wafer bonding to eliminate the pick-and-place process, and to reduce the size of the supporting substrate. As illustrated in FIG. 2A, a first wafer includes a substrate 212 upon which multiple LED structures 216 are formed, with contacts 218 at the top of the structures. A second wafer includes a carrier substrate 220 that includes through-hole vias 222, with contacts 228, 238 at the top and bottom of the carrier substrate, respectively. As illustrated in FIG. 2B, the first wafer is inverted and bonded to the second wafer, the contacts 218 of the LED structures being coupled to corresponding contacts 228 at the top of the carrier substrate. Optionally, to reduce interference with the light output from the top of the LED structures, the growth substrate 212 of the first wafer can be thinned or removed. The resultant wafer bonded structure is subsequently diced/singulated (dashed lines) into individual light emitting devices, with contacts 238 at the bottom of the carrier substrate for external connections to the LED structure. These devices can then be placed upon a printed circuit board and coupled to corresponding electrodes on the board, generally using solder reflow techniques.

Although the techniques of U.S. Pat. No. 7,329,905 eliminate the need to pick-and-place individual LED structures, and reduce the substrate area beyond the LED structure, compared to the conventional structure of FIG. 1, further cost reductions, or simplifications, in material and/or manufacturing, would be advantageous.

SUMMARY OF THE INVENTION

It would be advantageous to eliminate the need to provide through-hole vias in a chip-scale packaged light emitting device. It would also be advantageous to provide more options with regard to materials used for the substrate, and with regard to coupling through the substrate to the light emitting structure.

In an embodiment of this invention, the substrate that is used to support the growth of the LED structure is used to support the creation of a superstructure above the LED structure. The superstructure is preferably created as a series of layers, including conductive elements that form a conductive path from the LED structure to the top of the superstructure. The structure is subsequently inverted, such that the superstructure becomes the carrier substrate for the LED structure, and the original substrate is thinned or removed. The structure is created using materials that facilitate electrical conduction and insulation, as well as thermal conduction and dissipation.

BRIEF DESCRIPTION OF THE DRAWINGS

The invention is explained in further detail, and by way of example, with reference to the accompanying drawings wherein:

FIG. 1 illustrates an example prior art light emitting device.

FIGS. 2A-2B illustrate another example prior art light emitting device.

FIG. 3 illustrates an example flow diagram for creating a light emitting device with a superstructure that is suitable for supporting the light emitting device and for providing external contacts for coupling the light emitting device to a power source.

Throughout the drawings, the same reference numerals indicate similar or corresponding features or functions. The drawings are included for illustrative purposes and are not intended to limit the scope of the invention.

DETAILED DESCRIPTION

Figure 4A:
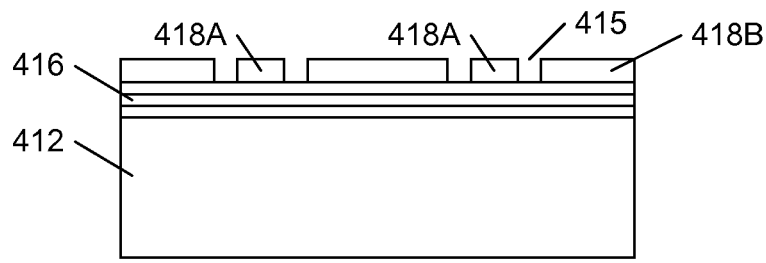
FIGS. 4A-4H illustrate example views of the light emitting device during manufacture.
Figure 4B:
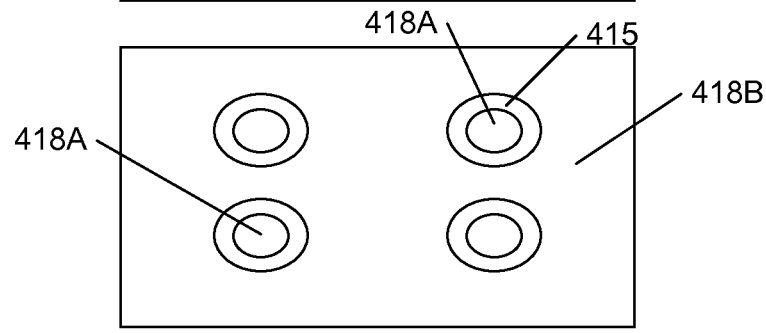
Figure 4C:
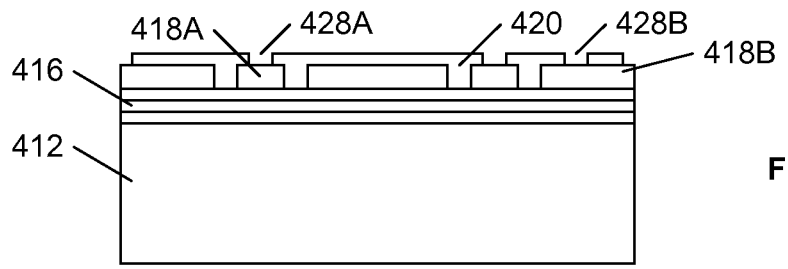
Figure 4D:
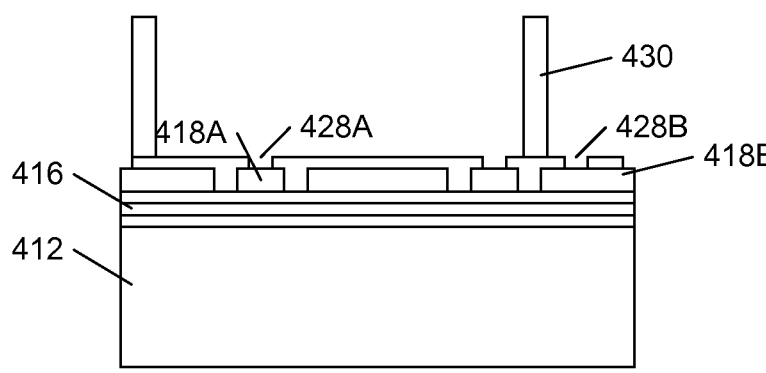
Figure 4E:
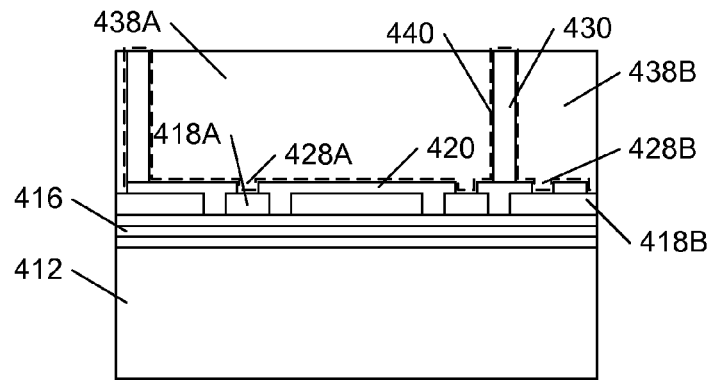
Figure 4F:
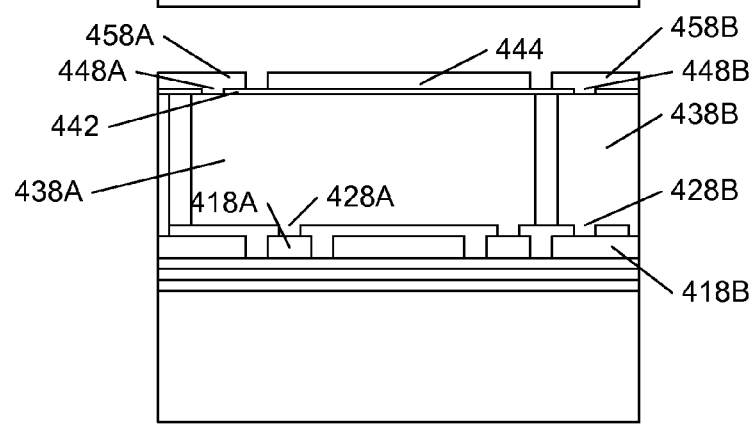

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

The process and device of this invention may be best understood with reference to the example flow diagram of FIG. 3, and the corresponding light emitting device structures of FIG. 4. Although this invention is particularly well suited for creating multiple light emitting devices on a wafer or other carrier, FIG. 4 and the accompanying description will address creation of a single example light emitting device. One of skill in the art will recognize that the number of devices being created on the carrier is irrelevant to the principles of this invention.

At 310, the light emitting element 416 and associated electrode contacts 418A, 418B are created on a substrate 412, typically a growth substrate that facilitates the creation of the semiconductor device and interconnection layers. The light emitting element 416 is illustrated as a stack of layers, corresponding to the typical sandwich of a light emitting substance between an anode and cathode. Any number of known techniques may be used to create the structure of FIGS. 4A and 4B, FIG. 4A being a side view and FIG. 4B being a top view.

In this example embodiment, the device is configured to provide a set of four contact areas 418A for coupling to the one of the electrodes (e.g. anode) of the light emitting element 416, and a larger surrounding area 418B for coupling to the other electrode (e.g. cathode). A gap 415 isolates these electrodes 418A, 418B. The use of four contact areas 418A and large area 418B facilitates a more uniform current density distribution within the device; in some embodiments, the contact areas 418A may be coupled to individual light emitting devices that provide different light output wavelengths (colors). For ease of reference, it is assumed herein that these electrodes 418A are intended to be coupled to a common source of power.

At 320, the created light emitting elements 416 may be tested, although testing may alternatively be performed after completing the creation of the superstructure, detailed below. At 330 (FIG. 4C), an insulating material 420, such as a dielectric, is applied to the structure, to isolate the electrodes from subsequent conductive layers except at select locations 428A, 428B. Conventional lithographic techniques may be used to provide this patterned layer of insulating material 420. As detailed further below, the light output is intended to exit the device in a direction away from the electrodes 418A-B and insulation 420; accordingly, the electrodes 418A-B and insulating 420 layers are preferably reflective to reduce the amount of light lost or absorbed within the device. Alternatively, the electrodes 418A-B or the insulating layer 420 may be transparent, relying on subsequent layers to provide such reflections. As also detailed further below, the insulation 420 preferably conducts heat and does not conduct electricity.

At 340 (FIG. 4D), relative tall insulating/isolating dividers 430 are created at select locations on the structure. In a typical embodiment, the light emitting element 416 may be in the order of about five microns thick, whereas the height of the dividers 430 may be in the order of a hundred microns or more. Lithographic techniques may be used to create these dividers 430, using a slurry, such as an epoxy resin, that is cured at the select locations. Although the dividers 430 are illustrated as having a rectangular cross-section, one of skill in the art will recognize that these dividers 430 may have a trapezoidal shape with a larger base than top area.

At 350 (FIG. 4E), the spaces between the dividers 430 are filled with metal 438A, 438B. Conventional application of a seed layer 440 within these spaces, followed by an overplating of metal, such as copper, may be used. This overplating may purposely extend above the dividers 430, and then planed, mechanically or chemically, or both, to expose the dividers 430, isolating the regions 438A, 438B. The metal 438A extends into the gap(s) 428A in the insulating layer 420, thereby contacting the electrode contact(s) 418A of the light emitting element 416. In like manner, the metal 438B extends into the gap(s) 428B, contacting the electrode contact(s) 418B.

At 360 (FIG. 4F), another insulating layer 442 is applied above the metal 438A, 438B, with gaps 448A, 448B at select locations. As with the insulation 420, the insulation 442 preferably conducts heat and does not conduct electricity. For example, the insulation 442 layer may include a resin or an inorganic material, such as $SiO_2$ or $Si_3N_4$.

At 370 (FIG. 4F), a final metal layer is applied above the insulating layer 442. In this example, three conductive contacts 444, 458A, 458B are formed. The metal at contact 458A extends into the gap 448A, providing contact through the metal 438A to the electrode 418A, and the metal at contact 458B extends into the gap 448B, providing contact through the metal 438B to the electrode 418B. These contacts 458A, 458B serve as the external contacts for coupling a power source to the light emitting element 416. One of skill in the art will recognize that although two contacts 458A, 458B are discussed above and illustrated in these figures, additional contacts may also be provided. For example, the light emitting elements 416 may include multiple segments, for providing different levels of illumination, different colors and combinations of colors, and so on.

The metal pad at 444 is not coupled to the underlying metal structures 438A, 438B, and serves to provide an external contact for heat dissipation. That is, assuming minimal heat insulation via the insulating layers 420, 442, the metal structures 438A, 438B will serve to conduct heat generated by the light emitting element 416 to the metal pad 444, and from there to the underlying substrate, such as a printed circuit board.

At 380 (FIGS. 4G-4H), the structure is inverted, such that the core metal structures 438A, 438B provide the structural support for the light emitting device, allowing the original growth substrate 412 to be removed, or reduced in thickness, thereby reducing optical losses as the light exits the 'top' of the light emitting element 416, in a direction opposite the core metal structures 438A, 438B. As illustrated in the bottom view of FIG. 4H, the contacts 444, 458A, 458B may extend across the width of the device, to facilitate external connections to the device.

Of particular note, a light emitting device created using the principles of this invention does not require wafer-bonding, and the location and orientation of the external contacts 458A, 458B are substantially independent of the location and orientation of the internal electrodes 418A, 418B, thereby providing substantial design flexibility, compared to the use of through-hole vias (222 in FIGS. 2A-2B).

Figure 4G:
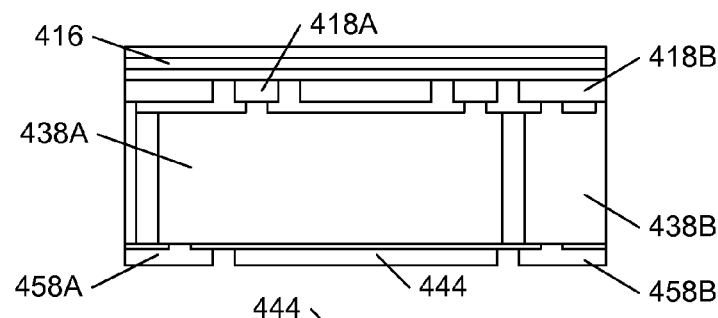
Figure 4H:
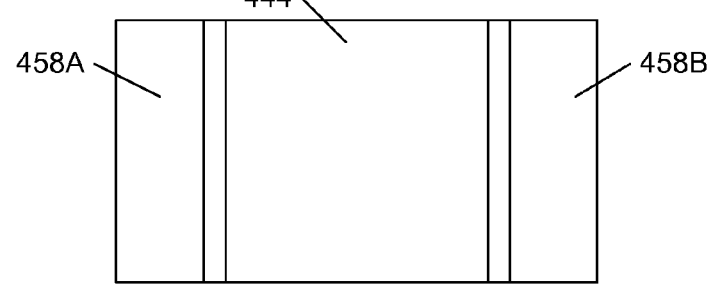

The structure of FIG. 4G may be further processed as required. For example, a layer of wavelength conversion material (e.g. phosphor) may be applied, to generate different color(s) from the color produced by the light emitting element 416, so as to produce, for example a combination of colors that produce a white light emitting device. In like manner, a lens may be created atop the structure, to provide particular optical qualities, and/or to protect the upper layers of the device.

One of skill in the art will recognize that the particular structure illustrated in FIGS. 4A-4H is merely an example structure. FIGS. 5-8 illustrate a few alternative structures that may be created using the techniques discussed above. For ease of reference, in these figures, the anode elements are shaded with a light shading, the cathode elements are shaded with a medium shading, and the thermal elements are shaded with a dark shading. Insulating sections are illustrated without shading.

Figure 5:
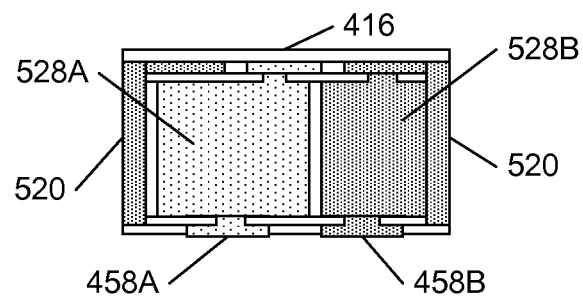
FIGS. 5-8 illustrate example alternative structures for forming a light emitting device.

FIG. 5 illustrates an example structure that does not have a separate thermal element, per se. In this example, a wall 520 extends around the perimeter of the device, and is coupled to the cathode structure 528B. This wall 520 is configured to dissipate heat through the outer perimeter of the device. An external heat sink or fin structure (not illustrated) may be affixed to the perimeter to further facilitate heat dissipation. One of skill in the art will recognize that the wall 520 may alternatively be insulated from the structures 528A, 528B, thereby forming a separate heat dissipation element that is not electrically coupled to the light emitting element 516.

Figure 6:
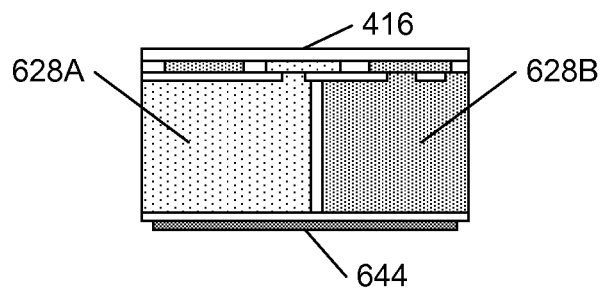

FIG. 6 illustrates an example structure that provides for external connections to the anode 528A and cathode 528B structures via the edges of the device. In this example, a thermal element 644 extends across the bottom of the device.

Figure 7:
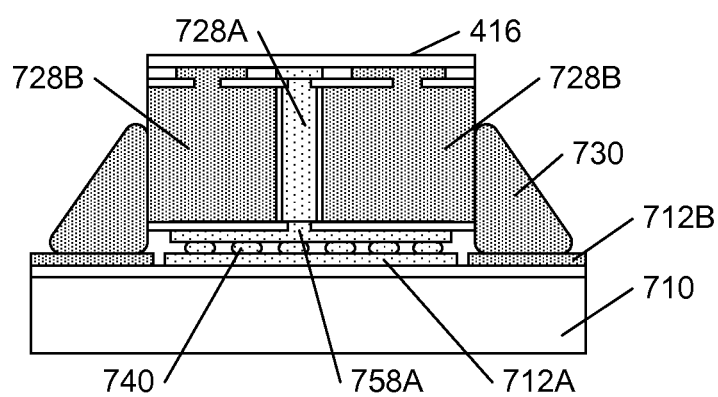

FIG. 7 illustrates another example of an edge-connected device, attached to a printed circuit board 710. In this example, only the cathode structure 728B extends to the edges, the anode structure 728A extending to a contact 758A at the bottom of the device. The cathode 728B may be coupled to conductors 712B on the printed circuit board 710 via solder joints 730, and the anode contact 758A may be coupled to the conductor 712A on the printed circuit board 710 via solder balls 740. A variety of methods of coupling the coupling the structure to the printed circuit board may be used, including the use of solder balls or a continuous solder film.

Figure 8:
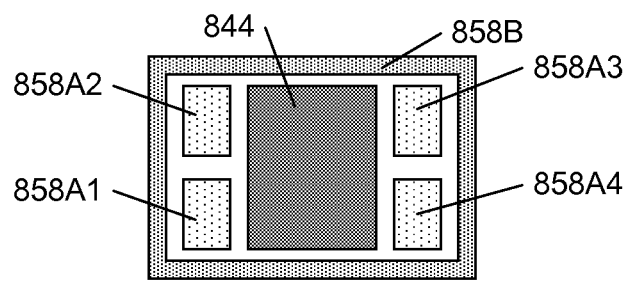

FIG. 8 illustrates a bottom view of a multiple-anode device. As noted above, the light emitting device may include a plurality of light emitting elements. By providing separate contacts 858A1-4, the intensity or color can be varied by selectively activating one or more combinations of anodes 858A1-4. In this example, a common cathode contact 858B is illustrated, although one of skill in the art will recognize that multiple cathode contacts may be provided to facilitate a variety of different configurations. In this example thermal element 844 is placed between anode and cathode contacts.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

I claim:

1. A method of creating a light emitting device comprising:
    forming a light emitting structure on a substrate, the light emitting structure having a top surface opposite the substrate and including at least first and second electrodes that are accessible at the top surface,
    forming a first insulating layer above the electrodes, with at least first and second openings in the insulating layer for contacting the at least first and second electrodes, respectively,
    forming non-removable insulating walls above the insulating layer, the insulating walls configured to provide insulation between the at least first and second openings, and
    filling at least a portion of spaces between the insulating walls with electrically conductive material, the electrically conductive material extending into the at least first and second openings to contact the at least first and second electrodes,
    wherein the insulating walls and electrical conductive material are at least an order of magnitude taller than a height of the light emitting structure above the substrate to provide permanent structural support to the light emitting element, thereby enabling removal of the substrate without damage to the light emitting structure.

2. The method of claim 1, including removing some or all of the substrate.

3. The method of claim 1, including:
    forming a second insulating layer above the electrically conductive material, with at least one further opening for contacting at least one portion of the electrically conductive material, and
    forming at least one electrically conductive contact that is coupled to the at least one portion of the electrically conductive material through the at least one further opening.

4. The method of claim 1, including:
    forming a second insulating layer on a first surface of the electrically conductive material that is opposite a second surface that is upon the first insulating layer, and
    forming at least one thermal contact on a first surface of the second insulating layer that is opposite a second surface that is upon the first surface of the electrically conductive material, the thermal contact being electrically insulated from the electrically conductive material.

5. The method of claim 1, wherein at least a part of the electrically conductive material extends to at least one exterior edge of the light emitting device.

6. The method of claim 1, wherein the insulating walls are resin walls at least 100 microns tall.

7. The method of claim 1, wherein the light emitting structure includes a plurality of light emitting elements.

8. The method of claim 7, wherein forming the insulating walls includes providing electrical insulation between electrodes of the plurality of light emitting elements.

9. The method of claim 1, wherein a plurality of light emitting devices are formed on the substrate, and the method includes singulating the light emitting devices.

10. The method of claim 1, including forming a wavelength conversion layer beyond the light emitting structure, in a direction opposite the first insulating layer.

11. The method of claim 1, including forming a lens element beyond the light emitting structure.

12. A light emitting device comprising:
    a light emitting structure that includes at least first and second electrodes,
    a first insulating layer above the at least first and second electrodes, in a direction opposite an intended light output direction, with at least first and second openings in the insulating layer for contacting the at least first and second electrodes, respectively,
    a plurality of insulating walls above the insulating layer, the insulating walls forming spaces within the walls, each space and enclosing walls including a conductive seed layer that extends into the at least first and second openings to contact the at least first and second electrodes, the insulating walls providing insulation between the at least first and second openings, and
    electrically conductive material situated on the conductive seed layer, the electrically conductive material providing electrical contact to the at least first and second electrodes, wherein the insulating walls and electrical conductive material are at least an order of magnitude taller than a thickness of the light emitting structure to provide structural support to the light emitting element.

13. The device of claim 12, including:
a second insulating layer above the electrically conductive material, with at least one further opening for contacting at least one portion of the electrically conductive material, and
at least one electrically conductive contact that is coupled to the at least one portion of the electrically conductive material through the at least one further opening.

14. The device of claim 12, including:
a second insulating layer on a first surface of the electrically conductive material that is opposite a second surface that is upon the first insulating layer, and
at least one thermal contact on a first surface of the second insulating layer that is opposite a second surface that is upon the first surface of the electrically conductive material, the thermal contact being electrically insulated from the electrically conductive material.

15. The device of claim 12, wherein at least a part of the electrically conductive material extends to at least one exterior edge of the light emitting device.

16. The device of claim 12, wherein the insulating walls are at least 100 microns tall.

17. The device of claim 12, wherein the light emitting structure includes a plurality of light emitting elements.

18. The device of claim 17, including electrical insulation between electrodes of the plurality of light emitting elements.

19. The device of claim 12, including a wavelength conversion layer.

20. The device of claim 12, including a lens element.

21. The method of claim 1, including: forming a seed layer after forming the insulating walls, the insulating walls having a base surface upon the insulating layer and a top surface opposite the base surface, the seed layer extending over the top surface of the insulating walls; and removing the seed layer from the top surface of the insulating walls after filling at least the portion of spaces between the insulating walls with electrically conductive material.

* * * * *